(12) United States Patent
Rao

(10) Patent No.: US 8,095,853 B2
(45) Date of Patent: Jan. 10, 2012

(54) DIGITAL MEMORY WITH FINE GRAIN WRITE OPERATION

(75) Inventor: G. R. Mohan Rao, McKinney, TX (US)

(73) Assignee: S. Aqua Semiconductor LLC, Wilmington, DE (US)

( * ) Notice: Subject to any disclaimer, the term of this patent is extended or adjusted under 35 U.S.C. 154(b) by 388 days.

(21) Appl. No.: 11/875,636

(22) Filed: Oct. 19, 2007

(65) Prior Publication Data

US 2009/0106505 A1    Apr. 23, 2009

(51) Int. Cl.
  *G11C 29/04*   (2006.01)
  *G06F 12/00*   (2006.01)

(52) U.S. Cl. .................. 714/764; 365/200; 711/105

(58) Field of Classification Search .................. None
  See application file for complete search history.

(56) References Cited

U.S. PATENT DOCUMENTS

| | | | |
|---|---|---|---|
| 4,208,730 A | | 6/1980 | Dingwall et al. |
| 4,335,459 A | * | 6/1982 | Miller .................. 714/755 |
| 4,685,089 A | * | 8/1987 | Patel et al. ............ 365/189.15 |
| 5,214,610 A | | 5/1993 | Houston |
| 5,233,560 A | | 8/1993 | Foss et al. |
| 5,381,363 A | * | 1/1995 | Bazes .................. 365/51 |
| 5,416,746 A | | 5/1995 | Sato et al. |
| 5,598,374 A | | 1/1997 | Rao |
| 5,636,174 A | | 6/1997 | Rao |
| 5,657,285 A | | 8/1997 | Rao |
| 5,686,730 A | | 11/1997 | Laudon et al. |
| 5,745,428 A | | 4/1998 | Rao |
| 5,802,395 A | | 9/1998 | Connolly et al. |
| 5,825,710 A | | 10/1998 | Jeng et al. |
| 5,828,610 A | | 10/1998 | Rogers et al. |
| 5,835,932 A | | 11/1998 | Rao |
| 5,856,940 A | | 1/1999 | Rao |
| 5,880,990 A | * | 3/1999 | Miura ..................... 365/154 |
| 5,995,438 A | | 11/1999 | Jeng et al. |
| 6,101,579 A | | 8/2000 | Randolph et al. |
| 6,256,221 B1 | | 7/2001 | Holland et al. |
| 6,512,715 B2 | | 1/2003 | Okamoto et al. |
| 6,529,412 B1 | | 3/2003 | Chen et al. |
| 6,621,758 B2 | | 9/2003 | Cheung et al. |
| 6,779,076 B1 | | 8/2004 | Shirley |
| 6,959,272 B2 | * | 10/2005 | Wohl et al. .................. 703/20 |

(Continued)

FOREIGN PATENT DOCUMENTS

JP      2128249       5/1990

(Continued)

OTHER PUBLICATIONS

International Search Report and Written Opinion mailed Jan. 23, 2009 for PCT/US2008-080530.

(Continued)

*Primary Examiner* — Gary Portka
(74) *Attorney, Agent, or Firm* — Schwabe, Williamson & Wyatt, P.C.

(57) ABSTRACT

Methods, systems, and apparatus for operating digital memory including determining, by a controller, a bit to be written to the digital memory and writing, by the controller, the bit. The bit may be part of a data word comprising a plurality of bits and both the determining and the writing may be performed at a granularity level finer than a data word. In embodiments, the bit to be written may be determined by error correction.

14 Claims, 5 Drawing Sheets

U.S. PATENT DOCUMENTS

| | | | |
|---|---|---|---|
| 7,124,348 | B2 | 10/2006 | Nicolaidis |
| 7,139,213 | B2 | 11/2006 | Rao |
| 7,207,024 | B2 | 4/2007 | Scheffer |
| 7,254,690 | B2 | 8/2007 | Rao |
| 7,724,593 | B2 | 5/2010 | Rao |
| 7,755,961 | B2 | 7/2010 | Rao |
| 2001/0015933 | A1* | 8/2001 | Reddy et al. ............. 365/230.05 |
| 2002/0174292 | A1 | 11/2002 | Morita et al. |
| 2003/0008446 | A1 | 1/2003 | Osada et al. |
| 2005/0007847 | A1 | 1/2005 | Bell et al. |
| 2005/0028061 | A1* | 2/2005 | Nicolaidis ................... 714/736 |
| 2005/0207201 | A1 | 9/2005 | Madan et al. |
| 2006/0067129 | A1 | 3/2006 | La Rosa et al. |
| 2007/0028060 | A1 | 2/2007 | Ware et al. |
| 2008/0123450 | A1 | 5/2008 | Rao |
| 2008/0123451 | A1 | 5/2008 | Rao |
| 2009/0097346 | A1 | 4/2009 | Rao |
| 2010/0202230 | A1 | 8/2010 | Rao |

FOREIGN PATENT DOCUMENTS

| | | |
|---|---|---|
| JP | 4162665 | 6/1992 |
| JP | 8180695 | 7/1996 |
| JP | 8185698 | 7/1996 |
| JP | 9213070 | 8/1997 |
| JP | 2003271445 | 9/2003 |

OTHER PUBLICATIONS

JEDEC; Double Data Rate (DDR) SDRAM Specification; pp. 1-85; JEDEC Solid State Technology Association 2005; Arlington, VA.
Micron; 512Mb: x4, x8, x16 DDR2 SDRAM Features; pp. 1-133; Micron Technologies, Inc.; Boise, Idaho.
International Preliminary Report on Patentability, issued in International Patent Application No. PCT/US2008/080530, mailed Apr. 29, 2010, 8 pages.
Office Action, issued in U.S. Appl. No. 11/771,853, mailed Sep. 24, 2008, 5 pages.
Office Action, issued in U.S. Appl. No. 11/771,853, mailed Jan. 13, 2009, 13 pages.
Notice of Allowance, issued in U.S. Appl. No. 11/771,853, mailed Aug. 19, 2009, 10 pages.
Notice of Allowance, issued in U.S. Appl. No. 11/771,853, mailed Jan. 8, 2010, 10 pages.
Office Action, issued in U.S. Appl. No. 11/771,895, mailed Oct. 30, 2008, 7 pages.
Office Action, issued in U.S. Appl. No. 11/771,895, mailed Jun. 17, 2008, 6 pages.
Notice of Allowance, issued in U.S. Appl. No. 11/771,895, mailed Feb. 17, 2010, 4 pages.
Office Action, issued in U.S. Appl. No. 11/771,895, mailed Sep. 16, 2009, 6 pages.
Office Action, issued in U.S. Appl. No. 11/873,283, mailed Dec. 31, 2009, 10 pages.
Office Action, issued in U.S. Appl. No. 11/873,283, mailed Jun. 25, 2009, 10 pages.
Office Action, issued in U.S. Appl. No. 11/873,283, mailed Mar. 10, 2010, 12 pages.
Office Action, issued in U.S. Appl. No. 11/873,283, mailed Jul. 16, 2010, 13 pages.
Advisory Action, issued in U.S. Appl. No. 11/873,283, mailed Sep. 21, 2010, 2 pages.
Chiyuan, Ma et al., "A DRAM Precharge Policy Based on Address Analysis," 10th Euromicro Conference on Digital System Design Architectures, Methods and Tools (DSD 2007), IEEE, Aug. 31, 2007, 5 pgs.
International Search Report and Written Opinion, issued in International Patent Application No. PCT/US2007/072974, mailed Jul. 16, 2008, 9 pages.
International Search Report and Written Opinion, issued in International Patent Application No. PCT/US2008/079423, mailed Dec. 19, 2008, 9 pages.
International Search Report and Written Opinion, issued in International Patent Application No. PCT/US2007/072981, mailed Jul. 16, 2008, 7 pages
Supplementary European Search Report, issued in EP Patent Application No. 07812687.7, mailed Aug. 12, 2009, 3 pages.
Supplementary European Search Report, issued in EP Patent Application No. 07799372.3, mailed Aug. 12, 2009, 3 pages.
Examination Report, issued in EP Patent Application No. 07812687.7, mailed Aug. 21, 2009, 3 pages.
Examination Report, issued in EP Patent Application No. 07799372.3, mailed Aug. 21, 2009, 5 pages.
International Preliminary Report on Patentability, issued in International Patent Application No. PCT/US2007/072974, mailed Jan. 22, 2009, 7 pages.
International Preliminary Report on Patentability, issued in International Patent Application No. PCT/US2007/072981, mailed Jan. 22, 2009, 5 pages.
International Preliminary Report on Patentability, issued in International Patent Application No. PCT/US2008/079423, mailed Apr. 29, 2010, 7 pages.
Office Action, issued in U.S. Appl. No. 11/873,283, mailed Nov. 3, 2010, 12 pages.
Office Action, issued in Korean Patent Application No. 10-2009-7002538, mailed Oct. 27, 2010, 2 pages.
Office Action, issued in Korean Patent Application No. 10-2009-7002540, mailed Oct. 27, 2010, 3 pages.
Notice of Allowance, issued in U.S. Appl. No. 12/767,517, mailed Feb. 25, 2011, 9 pages.
Notice of Allowance, issued in U.S. Appl. No. 11/873,283, mailed Mar. 31, 2011, 9 pages.

* cited by examiner

DIGITAL MEMORY WITH FINE GRAIN WRITE OPERATION

FIELD OF THE DISCLOSURE

Embodiments of the disclosure relate to integrated circuits, in particular to methods and apparatuses for performing write operations on digital memory devices at a granularity level less than a data word.

BACKGROUND OF THE DISCLOSURE

For well over three decades, semiconductor memories such as DRAM's, SRAM's, ROM's, EPROM's, EEPROM's, Flash EEPROM's, Ferroelectric RAM's, MAGRAM's and others, have played a vital role in many electronic systems. Their functions for data storage, code (instruction) storage, and data retrieval/access (Read/Write) continue to span a wide variety of applications. Usage of these memories in both stand alone/discrete memory product forms, as well as embedded forms such as, for example, memory integrated with other functions like logic, in a module or monolithic IC, continues to grow. Cost, operating power, bandwidth, latency, ease of use, the ability to support broad applications (balanced vs. imbalanced accesses), and nonvolatility are all desirable attributes in a wide range of applications.

Soft error correction is a challenge facing digital memory designers as memory cells density within digital memory designs, in particular DRAM and SRAM designs, continues to increase. As density increases, a single random event such as alpha particle collision, is more likely to cause soft errors or bit flips. Also, as density increases, such events are more likely to result in a larger number of flipped bits versus lower density memory devices. As a result, soft error correction is of increasing concern and chip designers take care to choose semiconductor and packaging materials to minimize the occurrence of cell or bit upset events. However, in most systems, soft errors are inevitable and must be corrected for.

Typically, error correction schemes are employed to detect and correct for soft errors. For example, forward error correction may be used; such schemes store redundant data in each data word. Alternatively, roll-back error correction may be used; such schemes use error correction codes, such as parity or Hamming codes, to detect and correct bit errors. Typical implementations utilize single bit error correction/single bit error detection schemes. Also, error correction schemes capable of correcting additional bit errors are also known. During a typical Read Modify Write (RMW) cycle, a data word is read from memory and an error correction engine detects any bit errors. Then, assuming an error is detected, the entire data word, including corrected bit(s), is written back to the memory device. The access operations required to do so, including precharging the bit lines, results in delay and consumes power. In some systems, a data word may be distributedly stored across multiple memory devices. In these systems, the entire corrected word is written back, even though there may only be a single bit error corresponding to a single memory cell in only one of the memory devices resulting in increased latency and power consumption across all memory devices.

BRIEF DESCRIPTION OF THE DRAWINGS

Embodiments of the disclosure will be readily understood by the following detailed description in conjunction with the accompanying drawings. Embodiments of the disclosure are illustrated by way of example and not by way of limitation in the figures of the accompanying drawings.

DETAILED DESCRIPTION

Figure 1:
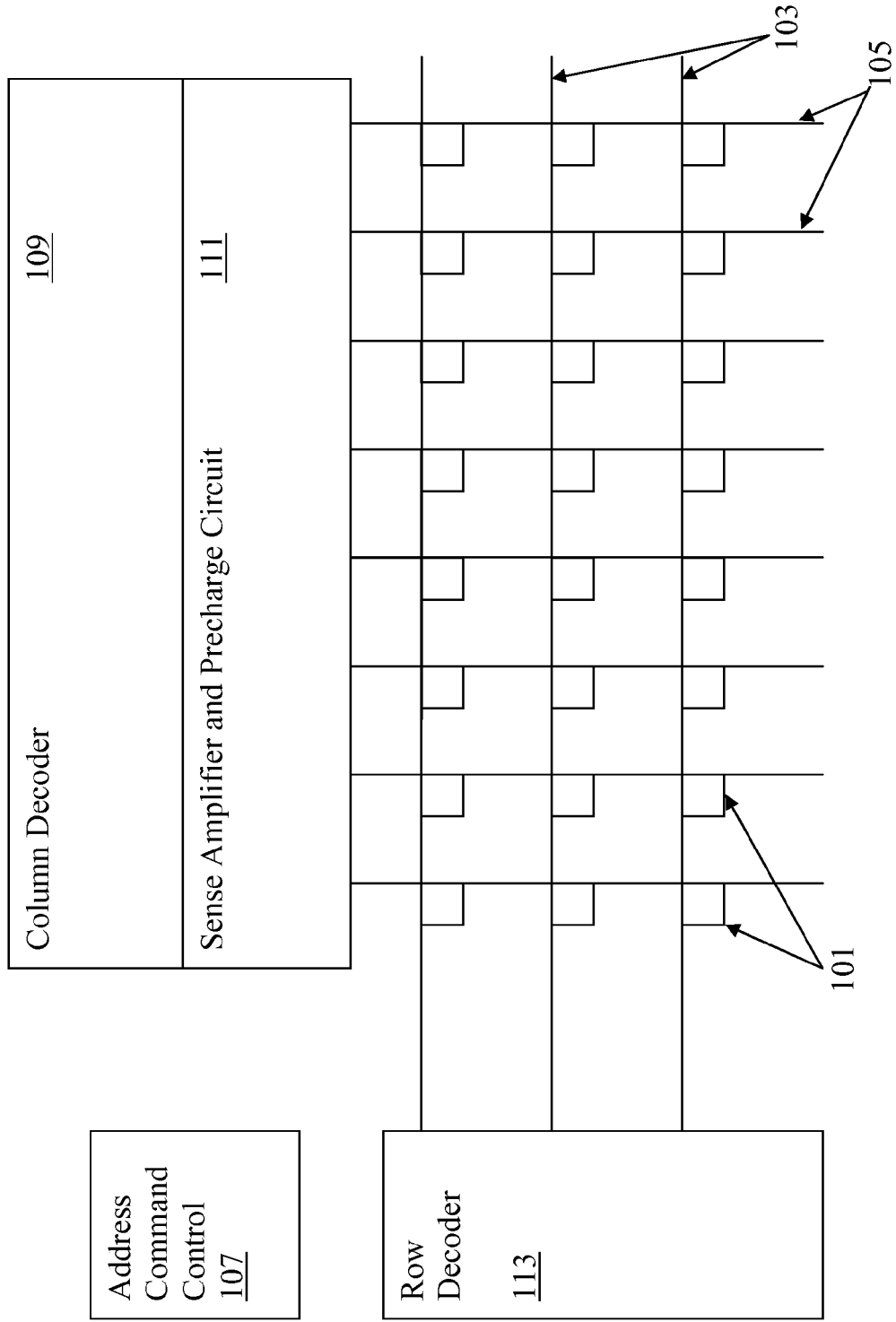
FIG. 1 shows a block diagram of a digital memory unit in accordance with embodiments.

In the following detailed description, reference is made to the accompanying drawings which form a part hereof wherein like numerals designate like parts throughout, and in which are shown, by way of illustration, specific embodiments in which the invention may be practiced. It is to be understood that other embodiments may be utilized and structural or logical changes may be made without departing from the scope of the present invention. Therefore, the following detailed description is not to be taken in a limiting sense, and the scope of the present invention is defined by the appended claims and their equivalents.

In the following detailed description, reference is made to the accompanying drawings which form a part hereof, and in which is shown by way of illustration embodiments of the disclosure. It is to be understood that other embodiments may be utilized and structural or logical changes may be made without departing from the scope of the disclosure. Therefore, the following detailed description is not to be taken in a limiting sense, and the scope of embodiments in accordance with the disclosure is defined by the appended claims and their equivalents.

Various operations may be described as multiple discrete operations in turn, in a manner that may be helpful in understanding various embodiments; however, the order of description should not be construed to imply that these operations are order dependent. Also, embodiments may have fewer operations than described. A description of multiple discrete operations should not be construed to imply that all operations are necessary.

The terms "coupled" along with its derivatives, may be used. It should be understood that these terms are not intended as synonyms for each other. Rather, in particular embodiments, "coupled" may mean that two or more elements are in direct physical or electrical contact. However, "coupled" may also mean that two or more elements are not in direct contact with each other, but yet still cooperate or interact with each other.

The description may use the phrase, "various embodiments," "in an embodiment," or "according to one embodiment," which may each refers to one or more of the same or different embodiments. Furthermore, the terms "comprising," "including," "having," and the like, as used with respect to embodiments as described in the present disclosure, are synonymous.

Various embodiments may employ a controller to write one or more bits of a data word to a digital memory device, wherein the data word comprises multiple bits including the one or more bits and the writing may be performed at a granularity level less than a data word. In embodiments, the granularity level may be smaller than a nibble. A nibble, as used herein, is a data word smaller than a byte. In embodiments, a nibble may be accessed by a digital memory device serially, rather than in parallel. In other embodiments, a nibble may be accessed in parallel. In embodiments, the writing may be performed particularly for the one or more bit(s) to be written. In embodiments, bit lines corresponding to a memory cell corresponding to the bit(s) to be written may be precharged wherein the precharging may occur at a granularity level smaller than a memory bank; in embodiments the precharging may occur at a granularity level smaller than a data word; in embodiments, the precharging may be performed particularly for the bit(s) to be written. In embodiments, the memory controller may determine an idle time to perform the write operation. In embodiments, the memory controller may perform intervening access operations (such as read, write, precharge, or other operations) on the memory device containing the memory cell corresponding to the single bit prior to determining an idle time to write the one or more bits to the corresponding memory cell(s).

In embodiments, an error correction engine may be employed to determine whether any bits of a data word read from a memory device are erroneous and, in embodiments, to correct one or more erroneous data bits. In embodiments, a controller may determine and/or receive a corrected bit to be written to the memory device. In embodiments, the controller may write the corrected bit to the memory device, the writing occurring at a granularity level smaller than a data word, a nibble, or performed particularly for the corrected bits.

In embodiments, the data word may be distributedly stored across multiple digital memory devices, such as for example multiple dual in-line memory modules (DIMM) or other memory devices. In embodiments, a controller may be configured to write a corrected or altered bit of the distributed data word by performing a write operation on only the memory device containing a memory cell corresponding to the corrected or altered bit, while performing no write operations on some or all of the remaining memory devices.

The term "data word" is used throughout. This term may refer, in embodiments, to multiple bits corresponding to a logical unit of data. Such a unit may include, in embodiments, 2, 4, 8, 16, 32, or 64 bits. In various embodiments, a data word may comprise any number of bits greater than a single bit. In embodiments, all bits of a data word may be accessed in parallel in a first access operation. In embodiments, some burst access operations may occur in a serial or sequential manner following a first access operation. In embodiments, some nibble access operations may occur in a serial or sequential manner following a first access operation.

According to various embodiments, FIG. 1 shows a block diagram of a digital memory unit 100 including a plurality of memory cells 101. Memory unit 100 is shown with 8 columns and 3 rows of memory cells 101. However, one of ordinary skill will recognize that memory unit 100 may comprise many more memory cells, such as thousands of columns of cells, or fewer memory cells. Memory cells 101 may, in embodiments, be DRAM memory cells or other types of cells. Memory cells 101 are each connected to row decoder 113 via one of a plurality of word lines 103. Each of memory cells 101 connected to a single word line 103 comprises a row of memory cells. Memory cells are each connected to column decoder 109 and sense amplifier and precharge circuit 111 via a corresponding one of a plurality of bit lines 105. Each of memory cells 101 connected to a single bit line 105 comprises a column of memory cells. Thus, each of memory cells 101 is in both a single column and a single row of memory cells.

Address command and control circuit 107 may be configured to receive, from I/O terminals not shown, an address corresponding to particular one or more of memory cells 101 and a corresponding command to write corresponding values to the particular one or more of memory cells 101. The particular one or more memory cells 101 may, in embodiments, comprise less than a data word. In embodiments, the particular one or more memory cells 101 may comprise less than a nibble. In embodiments, address command and control circuitry may be configured to receive an address corresponding to only a particular one of memory cells 101. The received address may comprise a row portion corresponding to one of row lines 103 and a column portion corresponding to one or more of bit lines 105. Address command and control circuitry 107 may be configured to pass the row portion of the received address to row decoder 113 and the column portion to column decoder 109 which may be configured to decode the received row and column portions, respectively.

Sense amplifier and precharge circuit 111, which may be coupled to column decoder 109, may be configured to precharge a particular one or more of bit lines 105 corresponding to the received column portion and/or the particular one or more of memory cells 101. In embodiments sense amplifier and precharge circuit 111 may be configured to perform the precharging at a granularity level less than an entire bank of memory cells. In embodiments, it may be configured to perform the precharging at a granularity level of less than a byte, a nibble, or configured to perform the precharging particularly for the bit line(s) corresponding to the bit(s) to be written. For example, if the received address corresponds to three of memory cells 101, then sense amplifier and precharge circuit 111 may be configured in embodiments, to precharge those of bit lines 105 corresponding to those particular three memory cells.

Column decoder 109 may be configured to cause sense amplifiers within sense amplifier and precharge circuit 111 to drive the particular one or more of bit lines 105 to one or more voltage values corresponding to one or more logical bit values to be written to the particular one or more of corresponding memory cells 101. Row decoder 113 may be configured to receive a row portion of the received address. Row decoder may be configured to activate a one of word lines 103 corresponding to the particular one or more of memory cells 101 to be written. Such activation of one of word lines 103 may serve to activate the particular one or more memory cells 101 connected to the activated one of word lines 103. In embodiments, additional memory cells 101 may also be activated. In embodiments, additional action must be taken to activate the particular one or more of memory cells 101. Such activation of the particular one or more memory cells 101 may cause the voltages driven to the particular one or more bit lines 105 to be input, with assistance from sense amplifiers within amplifier and precharge circuit 111, to storage element(s) within the particular one or more of memory cells 101, thus completing a write operation to the particular one or more memory cells 101.

In embodiments, only a single one of memory cell 101 may be activated and a corresponding data value input into its storage element. In embodiments, multiple memory cells 101 numbering less than a data word may be activated and corresponding data values input into their corresponding storage elements. In this way, memory device unit 100 may be configured to be operated to perform a write operation at a granularity less than a whole data word, less than a nibble, or particularly for the bit(s) of data to be written. In particular, a single bit of a data word may be written in embodiments to a corresponding memory cell 101 without simultaneously writing any other bits of the data word. In alternative embodiments, memory device unit 100 may be configured to be operated to write multiple bits of data to multiple memory cells 101 comprising less than a whole data word. Thus, less power may be consumed by, for example, precharging less than an entire memory bank, or precharging at a granularity less than a subbank, array, subarray, data word or a nibble, or precharging particularly for the bit line(s) corresponding to the bit(s) to be written. Also, memory device unit 100 may consume less power by virtue of writing at a granularity level less than a data word, a nibble, or by performing a write operation particularly for the bit(s) to be written. In embodiments, memory device unit 100 may perform write operations with reduced latency by not being required to wait for all bit lines in a memory bank to be precharged before writing the single bit. Also, latency may be reduced by writing at a granularity level less than a data word, a nibble, or particularly for the bit(s) to be written.

In embodiments the bits to be written to the particular one or more of memory cells 101 may include one or more altered bits, according to various embodiments. Such altered bits may, in embodiments, be corrected bits corresponding to erroneous bits detected by an error correction engine or other device. In embodiments, such erroneous bits may have been caused by any of various soft errors. In embodiments, the number of altered bits may equal the number of the particular one or more of memory cells 101. In other embodiments, the number of altered bits may be fewer than the number of the particular one or more of memory cells 101.

Figure 2:
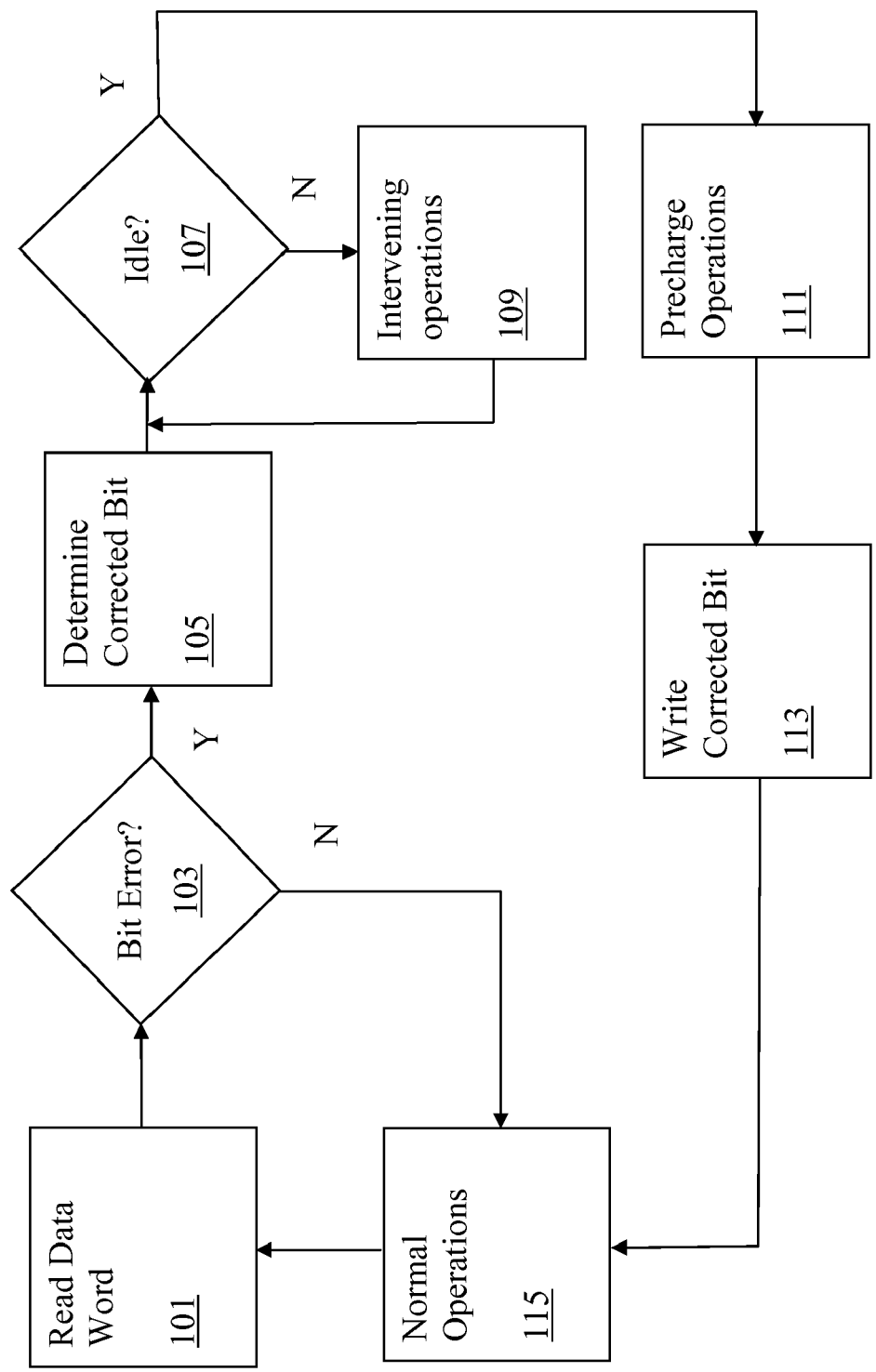
FIG. 2 shows a flow chart of a method for detecting bit errors and writing corrected bits to a digital memory unit according to embodiments

FIG. 2 shows a flow chart of a method for detecting bit errors and writing corrected bits to a digital memory unit according to embodiments. In embodiments, a controller may send an address and a corresponding READ command to a digital memory device such as, for example, digital memory unit 100 in FIG. 1. In response, a data word may be read from the memory device at block 201. Once read, error detection is performed on the data word to determine whether there are one or more bit errors within the data word 203. If there are no detected bit errors, normal operation of the memory device continues 215. If there is a detected bit error, then a corrected bit and bit position of the corrected bit may be determined 205. In embodiments, this determination may be performed by the controller and/or an error correction engine. In embodiments, the error correction engine may be part of the controller or other device. At this point, a controller may determine whether the current time is an idle time of the digital memory device at block 207. In alternative embodiments, the controller may not perform this determination and may move straight to block 211. If the device is not idle, the controller may operate the digital memory device to perform intervening operations 209. In embodiments, such intervening operations may include READ, WRITE, PRECHARGE or other operations. In embodiments, the controller may determine whether the memory device is idle by determining whether such intervening operations are scheduled for the memory device. In this manner, the controller may wait for an idle time.

Once an idle time is determined, the controller may command the memory device to precharge one or more bit lines 211. In embodiments, the one or more bit lines may correspond to a granularity level less than a bank, subbank, array, subarray, data word, or nibble. In embodiments, the memory device may precharge bit lines particular to the determined corrected bit(s) to be written. Once precharged, the corrected bit(s) may be written to corresponding memory cells of the digital memory device 213. In this way, corrected bits caused by soft errors may be corrected during an idle time of the device; this may in embodiments improve performance by not delaying scheduled operations that are not affected by the soft error. Also, because the precharging and writing of only a small number of bits in embodiments require only a very small amount of time and/or power, error correction may be performed with virtually no impact on operating speed or power consumption of the memory device. In embodiments, a timer or other mechanism may be employed as a fail-safe in the event that an idle time is not determined within a reasonable amount of time. In embodiments, the controller may write the corrected bit without waiting for an idle time if a READ operation is scheduled for the data word containing the erroneous bit. In embodiments, the controller may abandon the writing of the corrected bit if a WRITE operation is scheduled for the data word containing the erroneous bit.

Figure 3:
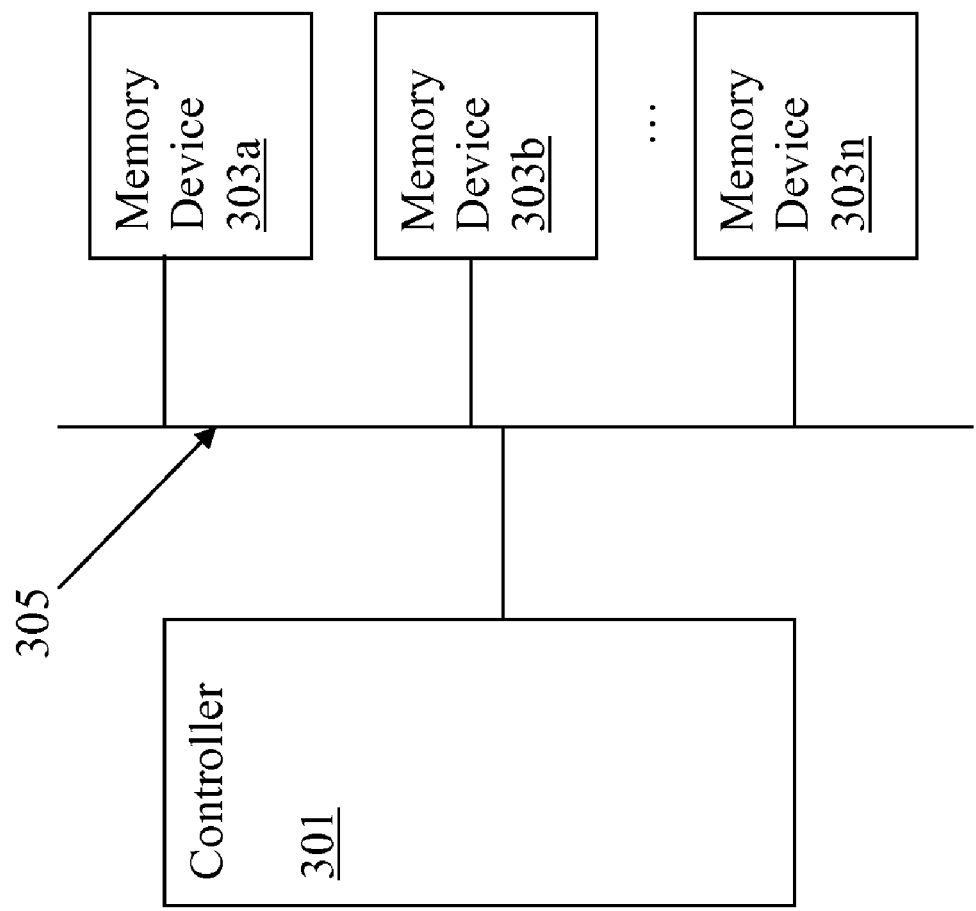
FIG. 3 shows a block diagram of a system comprising multiple memory devices and a controller in accordance with various embodiments.

FIG. 3 shows a block diagram of system 300 comprising multiple memory devices 303 and a controller 301 in accordance with various embodiments. Controller 301 is shown connected to bus 305. Bus 305 may include, in embodiments, multiple busses. In particular, bus 305 may include a data bus and/or an address bus. System 300 may include, in embodiments multiple memory devices 303. System 300 is shown with n number of memory devices 303; n may be any number but is typically an even number such as, for example, 2, 4, 6, or 8 devices. In embodiments, memory devices 303 may be dual in-line memory modules (DIMM) or other devices. In embodiments, memory devices 303 may be configured to distributedly store data words across multiple memory devices 303 such that some bits of a data word may be stored in memory device 303a, some in 303b, and so on.

Controller 301 may be configured to determine one or more bits of a data word to be written. Such bit(s) may be, in embodiments, altered or corrected bit(s). In embodiments, such altered or corrected bit(s) may correspond to detected soft error(s). In other embodiments, such altered bit(s) may correspond to bit(s) altered for another purpose. In embodiments, the one or more bits to be written may all correspond to sections of the data word that are stored in one or more of memory devices 303 that comprise less than n memory devices. In embodiments, Controller 301 may be configured to perform a write operation only on those of memory devices 303 that contain memory cell(s) corresponding to the determined one or more bits of a data word to be written. In such embodiments, controller 301 may be configured to perform no write operations on those of memory devices 301 that do not contain memory cells corresponding to the determined one or more bits of a data word to be written. Thus, controller 301 may be configured to perform write operations on some, but not all, memory devices distributedly storing the data word. As such, less power may be consumed by operating only a subset of memory devices 303. Also, the other of memory devices 303 may, in embodiments, remain free to perform other unrelated operations. Each of memory devices 303 that do contain memory cells corresponding to the data bits to be written, may be configured to only precharge bit lines corresponding to those memory cells and may be configured to only perform write operations on the corresponding memory cells thus saving additional power and further reducing latency as described elsewhere within this application.

Figure 4:
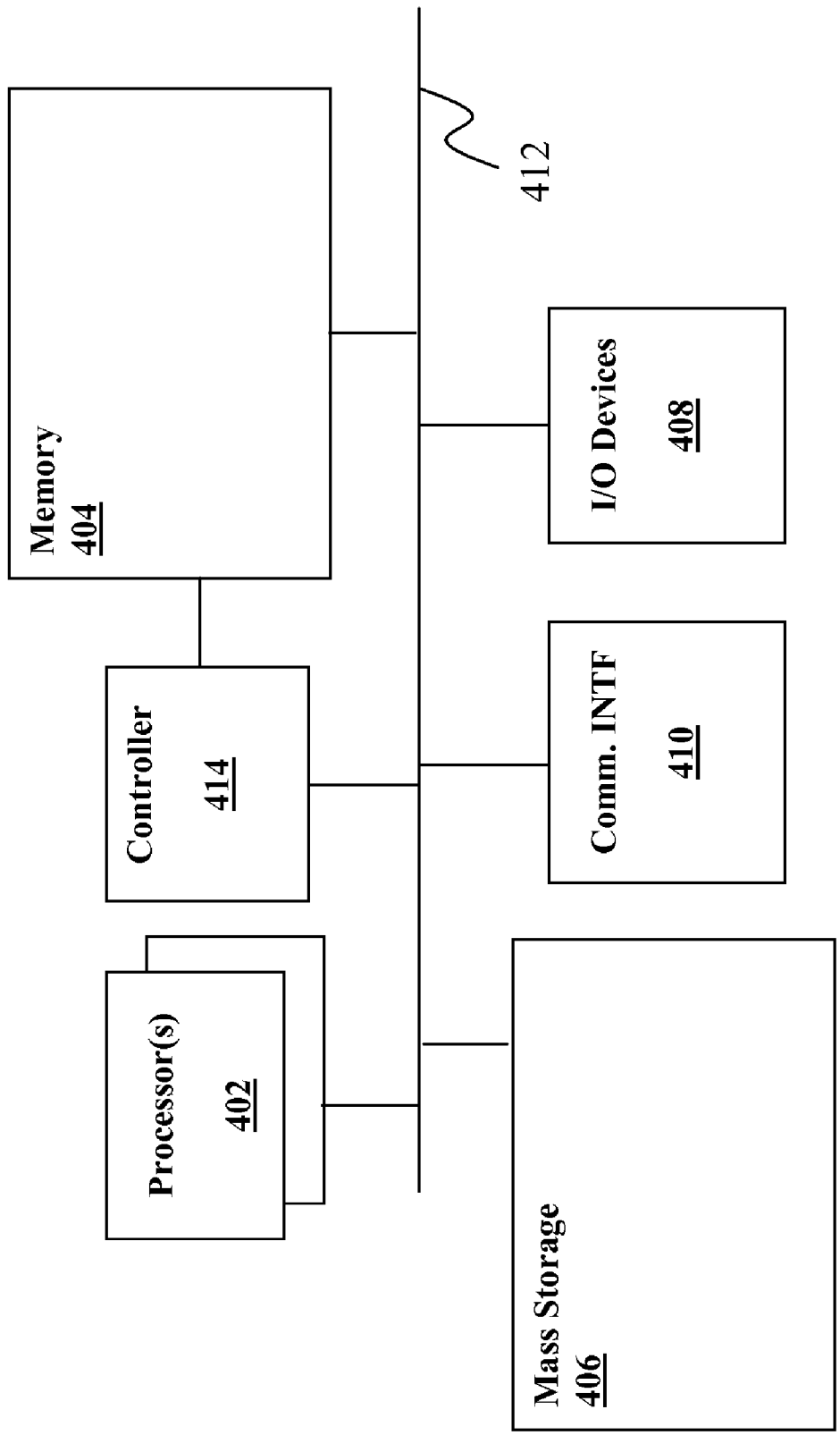
FIG. 4 shows a block diagram of a computer system with one or more digital memory units according to embodiments.

FIG. 4 illustrates an example computing system/device suitable for use to practice various embodiments of the present invention. As shown, computing system/device 400 may include one or more processors 402, and system memory 404, such as for example digital memory device 100 of FIG. 1. Additionally, computing system/device 400 may include mass storage devices 406 (such as diskette, hard drive, CDROM and so forth), input/output devices 408 (such as keyboard, cursor control and so forth) and communication interfaces 410 (such as network interface cards, modems and so forth). The elements may be coupled to each other via system bus 412, which represents one or more buses. In the case of multiple buses, they may be bridged by one or more bus bridges (not shown). Finally, controller 414 embodied with some or all of the teachings of the present invention may be provided and configured to operate memory 404. In embodiments, controller 414 may be configured to issue READ and WRITE access commands to memory 404 and also to issue precharge commands to memory 404 in accordance with various embodiments of the present invention. In alternative embodiments, memory 404 may include a controller (not shown) to perform some or all of the functions of controller 414. In embodiments, some or all of the functions of controller 414 could be effectively implemented within memory 404. In embodiments, such functions may be performed by use of a mode register within memory 404. Just as an example, in embodiments a mode may be set using the mode register such that precharge occurs at the beginning or set such that precharge occurs at the end of a cycle. All or portion of system memory 404 may be endowed with all or portions of the teachings of the present invention, earlier described.

Other than the teachings of the various embodiments of the present invention, each of the elements of computer system/device 400 may perform its conventional functions known in the art. In particular, system memory 404 and mass storage 406 may be employed to store a working copy and a permanent copy of programming instructions implementing one or more software applications.

Although FIG. 4 depicts a computer system, one of ordinary skill in the art will recognize that embodiments of the present invention may be practiced using other devices that utilize DRAM or other types of digital memory such as, but not limited to, mobile telephones, Personal Data Assistants (PDAs), gaming devices, high-definition television (HDTV) devices, appliances, networking devices, digital music players, laptop computers, portable electronic devices, telephones, as well as other devices known in the art.

Figure 5:
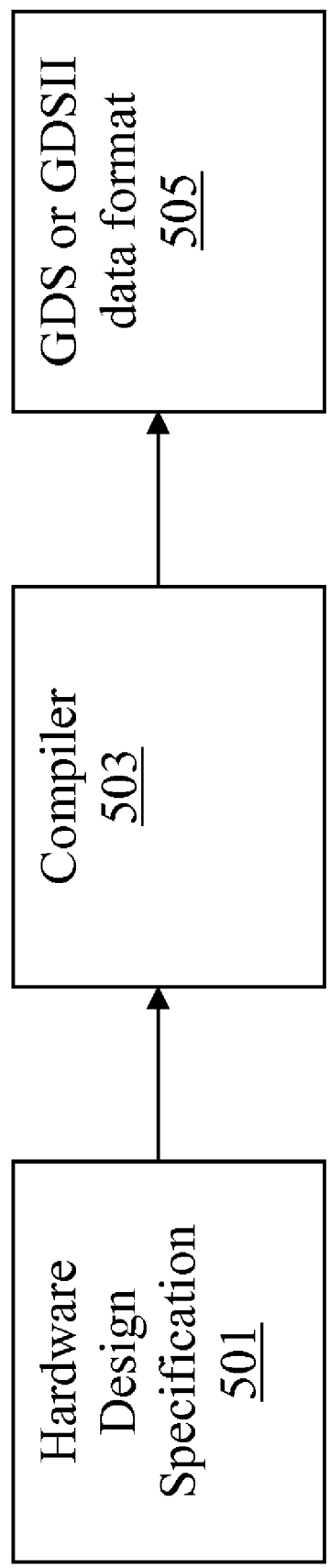
FIG. 5 shows a block diagram of a hardware design specification being compiled into GDS or GDSII data format in accordance with various embodiments.

In various embodiments, the earlier described memory cells are embodied in an integrated circuit. Such an integrated circuit may be described using any one of a number of hardware design languages, such as but not limited to VHSIC hardware description language (VHDL) or Verilog. The compiled design may be stored in any one of a number of data format, such as but not limited to GDS or GDS II. The source and/or compiled design may be stored on any one of a number of medium such as but not limited to DVD. FIG. 5 shows a block diagram depicting the compilation of a hardware design specification 501 which may be run through compiler 503 producing GDS or DGSII data format 503 describing an integrated circuit in accordance with various embodiments.

Although specific embodiments have been illustrated and described herein for purposes of description of the preferred embodiment, it will be appreciated by those of ordinary skill in the art that a wide variety of alternate and/or equivalent implementations may be substituted for the specific embodiment shown and described without departing from the scope of the present invention. Those with skill in the art will readily appreciate that the present invention may be implemented in a very wide variety of embodiments. This application is intended to cover any adaptations or variations of the embodiments discussed herein.

What is claimed is:

1. A method of operating digital memory, the method comprising:
reading, by access circuitry that is coupled to a plurality of bit lines of a memory array for the digital memory, a multi-bit data word from a subset of a plurality of memory cells of the memory array;
writing, by the access circuitry, a bit of the multi-bit data word, wherein said writing includes driving, by a sense amplifier circuit of the access circuitry, a bit line associated with a memory cell associated with the bit of the multi-bit data word to a voltage level corresponding to a logical value of the bit, and wherein said driving excludes other bit lines associated with other ones of the subset of the plurality of memory cells associated with the multi-bit data word from being driven; and
precharging the bit line associated with the memory cell, wherein said precharging excludes the other bit lines.

2. The method of claim 1, further comprising:
determining, by a controller, to perform said writing to the multi-bit data word; and
performing, by the access circuitry, an intervening access operation on the plurality of memory cells, wherein:
said determining occurs at a first time;
said performing an intervening access operation occurs at a second time;
said writing occurs at a third time; and
the second time is later than the first time and the third time is later than the second time.

3. The method of claim 2, further comprising:
identifying, by the controller, an idle time of the digital memory; and
selecting, by the controller, the idle time as the third time.

4. The method of claim 1, wherein the multi-bit data word contains an erroneous bit, and wherein the bit is a corrected bit corresponding to the erroneous bit.

5. The method of claim 4, further comprising:
detecting, by an error correction machine, the erroneous bit; and
receiving, by the controller, the corrected bit from the error correction machine.

6. An apparatus, comprising:
a memory array including a plurality of memory cells and a plurality of bit lines; and
access circuitry coupled to the plurality of memory cells of the memory array via the plurality of bit lines, wherein the access circuitry is configured to perform a read operation on a multi-bit data word wherein the access circuitry is further configured to perform a write operation on the multi-bit data word at a granularity level equal to one bit, and wherein the access circuitry includes:
a sense amplifier circuit configured to drive, during the write operation, a bit line associated with a memory cell of the multi-bit data word to a voltage level, wherein the voltage level corresponds to a logical value of a bit to be written to the memory cell, and wherein the sense amplifier circuit is further configured to exclude other bit lines of the multi-bit data word from being driven during the write operation; and
precharge circuitry coupled to the plurality of memory cells, wherein the precharge circuitry is configured to precharge the multi-bit data word.

7. The apparatus of claim 6, wherein the precharge circuitry is configured to precharge the multi-bit data word at a precharge granularity level that is finer than a data word size of the multi-bit data word.

8. A system, comprising:
a digital memory, including:

a memory array comprising a plurality of memory cells and a plurality of bit lines; and access circuitry coupled to the plurality of memory cells of the memory array via the plurality of bit lines, wherein the access circuitry is configured to perform a read operation on a multi-bit data word, wherein the access circuitry is further configured to perform a write operation on the multi-bit data word at a granularity level equal to one bit, wherein the write operation writes a corrected bit to the multi-bit data word, and wherein the access circuitry includes:

a sense amplifier circuit configured to drive, during the write operation, a bit line associated with a memory cell of the multi-bit data word to a voltage level, wherein the voltage level corresponds to a logical value of the corrected bit to be written to the memory cell, and wherein the sense amplifier circuit is further configured to exclude other bit lines of the multi-bit data word from being driven during the write operation;

precharge circuitry coupled to the plurality of memory cells, wherein the precharge circuitry is configured to precharge the multi-bit data word; and a controller coupled to the digital memory via a plurality of terminals, wherein the controller comprises logic coupled to the plurality of terminals, and wherein the logic is configured to:

determine the corrected bit to be written to the multi-bit data word; and output the corrected bit to the digital memory via the terminals.

9. The system of claim 8, wherein the digital memory further comprises both a first memory device and a second memory device, wherein the multi-bit data word is distributedly stored in both the first memory device and the second memory device, and wherein the logic is further configured to write to only a selected one of the first memory device and the second memory device.

10. An apparatus, comprising:

a memory array including a plurality of memory cells and a plurality of bit lines;

means for reading a multi-bit data word at a granularity level equal to a data word size of the memory array, wherein the multi-bit data word comprises a number of memory cells equal to the data word size, and for driving, during a write operation, a bit line of a memory cell of the multi-bit data word to a voltage level, wherein the voltage level corresponds to a logical value of a bit to be written to the memory cell, and wherein the write operation excludes other bit lines of the multi-bit data word from being driven during the write operation; and means for precharging one or more bit lines of the memory array at a granularity level finer than the data word size.

11. The apparatus of claim 10, further comprising:

means for determining the bit to be written to the memory cell; and means for detecting an erroneous data bit of the data word, wherein the bit to be written to the memory cell is a corrected bit corresponding to the erroneous bit.

12. An article of manufacture, comprising a non-transitory computer-readable medium including a plurality of computer-readable hardware design language instructions, or compilation of the hardware design language instructions, wherein the hardware design language instructions specify an implementation of the apparatus of claim 6 as an integrated circuit.

13. The article of manufacture of claim 12, wherein the hardware design language comprises either VHDL or Verilog.

14. The apparatus of claim 6, wherein the multi-bit data word contains an erroneous bit, and wherein the bit to be written to the memory cell is a corrected bit that corresponds to the erroneous bit.

* * * * *